(12) United States Patent
Martin et al.

(10) Patent No.: US 9,190,960 B2
(45) Date of Patent: Nov. 17, 2015

(54) AUDIO POWER AMPLIFIER

(71) Applicant: INNOVATIVE ELECTRONIC DESIGNS, LLC, Louisville, KY (US)

(72) Inventors: Hardison G. Martin, Louisville, KY (US); Robert A. Ponto, Louisville, KY (US)

(73) Assignee: Innovative Electronic Designs, LLC, Louisville, KY (US)

( * ) Notice: Subject to any disclaimer, the term of this patent is extended or adjusted under 35 U.S.C. 154(b) by 61 days.

(21) Appl. No.: 14/222,663

(22) Filed: Mar. 23, 2014

(65) Prior Publication Data
US 2015/0270810 A1   Sep. 24, 2015

(51) Int. Cl.
| H03F 3/38 | (2006.01) |
| H03F 1/02 | (2006.01) |
| H03F 3/185 | (2006.01) |
| H03F 3/21 | (2006.01) |

(52) U.S. Cl.
CPC .............. *H03F 1/0233* (2013.01); *H03F 3/185* (2013.01); *H03F 3/21* (2013.01); *H03F 2200/03* (2013.01); *H03F 2200/165* (2013.01)

(58) Field of Classification Search
CPC .................................. H03F 3/38; H03F 1/0288
USPC .......... 330/10, 124 R, 295, 84, 126
See application file for complete search history.

(56) References Cited

U.S. PATENT DOCUMENTS

| 4,571,554 A |   | 2/1986 | Ponto |   |
| 5,428,642 A |   | 6/1995 | Ponto |   |
| 6,038,265 A | * | 3/2000 | Pan et al. | 375/316 |
| 6,104,248 A | * | 8/2000 | Carver | 330/297 |
| 8,154,887 B2 | * | 4/2012 | Hinds et al. | 363/15 |
| 8,179,957 B2 | * | 5/2012 | Bryant | 375/238 |
| 8,884,657 B2 | * | 11/2014 | Gan et al. | 327/108 |
| 2009/0267656 A1 | * | 10/2009 | Stanley | 327/131 |

* cited by examiner

*Primary Examiner* — Henry Choe
(74) *Attorney, Agent, or Firm* — Keith L. Jenkins, Registered Patent Attorney LLC; Keith L. Jenkins

(57) ABSTRACT

Improvements to U.S. Pat. No. 5,428,642 including use of a single clock providing a first frequency to drive a power supply and a second frequency, twice the first frequency, to dual channel pulse width modulators and audio amplifiers. The power supply is improved to provide enough output voltage that the amplifier stays below 90% modulation and the first frequency driver eliminates the dead band, thereby improving efficiency. Current limiting, even against shorts in the load, is provided by inductor inputs to the clipper circuits, where the inductors are in the magnetic fields of the output chokes. The audio amplifiers are isolated by optical couplers for the audio signal and by an optical coupler and isolation transformers for the clock. One clock amplifier supplies both amplifier channels. The pulse width modulator uses the optically isolated clock and receives clipped audio directly. Two channels fit in the space of one old channel.

20 Claims, 15 Drawing Sheets

AUDIO POWER AMPLIFIER

TECHNICAL FIELD

This invention relates to providing an improved electronic audio power amplifier.

BACKGROUND

Audio amplifiers are used to amplify electronic audio signals from various sources, such as microphones, radio receivers, TV receivers, and generate audio signals sufficient to drive audio speakers, some of which may have very high power requirements. Accordingly, inventors constantly search for improvements, including higher efficiency, lower cost, improved sound quality, and smaller size.

Therefore, a need exists for an audio power amplifier that has a higher efficiency, lower cost, improved sound quality, and smaller size.

OBJECTS AND FEATURES OF THE INVENTION

A primary object and feature of the present invention is to overcome the above-mentioned problems and fulfill the above-mentioned needs.

Another object and feature of the present invention is to provide an audio power amplifier that provides a 5% increase in efficiency by removing a dead band necessitated by dual-clock synchronization in the prior art.

It is a further object and feature of the present invention to provide an audio power amplifier that has a single clock for both audio signal processing and power supply synchronization.

It is a further object and feature of the present invention to provide an audio power amplifier that includes clipping level control based on the output current.

It is a further object and feature of the present invention to provide an audio power amplifier that includes an inductor under an output filter choke to sense the output current and control the clipping level based on the output current.

It is a further object and feature of the present invention to provide an audio power amplifier that provides twice the amplifier power at a smaller size.

It is a further object and feature of the present invention to provide an audio power amplifier that provides one-fourth of the harmonic distortion of the improved-upon amplifier.

It is a further object and feature of the present invention to provide an audio power amplifier that provides one-half the cost per watt compared to the improved-upon amplifier.

It is a further object and feature of the present invention to provide an audio power amplifier that provides an eight decibel improvement in signal-to-noise ratio.

It is a further object and feature of the present invention to provide an audio power amplifier that provides one-fourth the total clock output at 200 KHz compared to the improved-upon amplifier.

It is a further object and feature of the present invention to provide an audio power amplifier that provides a current limiter that inductively senses output power to control a clipper circuit.

It is an additional primary object and feature of the present invention to provide such a system that is efficient, inexpensive and handy. Other objects and features of this invention will become apparent with reference to the following descriptions.

SUMMARY OF THE INVENTION

An improved audio power amplifier improving on the audio power amplifier of U.S. Pat. No. 5,428,642 by the same inventor, the improvements including: a single clock coupled directly to the power supply and to the audio processing circuitry via an optical coupler; a small inductor sensing output choke current to control the clipping level; and the use of an optical coupler and an isolated power supply. The single clock improvement removes a dead band, that had been required to protect against mis-synchronization of the two clocks in the previous invention, and so increases the efficiency of the amplifier, thereby lowering power consumption and waste heat production. The small inductor sensing the output choke current to control the clipping level limits the maximum output power that the amplifier can produce, protecting the amplifier from short circuits and protecting downstream components, such as audio speakers, from being over driven.

BRIEF DESCRIPTION OF THE DRAWINGS

The present invention will hereinafter be described in conjunction with the following drawing figures, wherein like numerals denote like elements.

DETAILED DESCRIPTION OF THE PRESENT INVENTION

Figure 1:
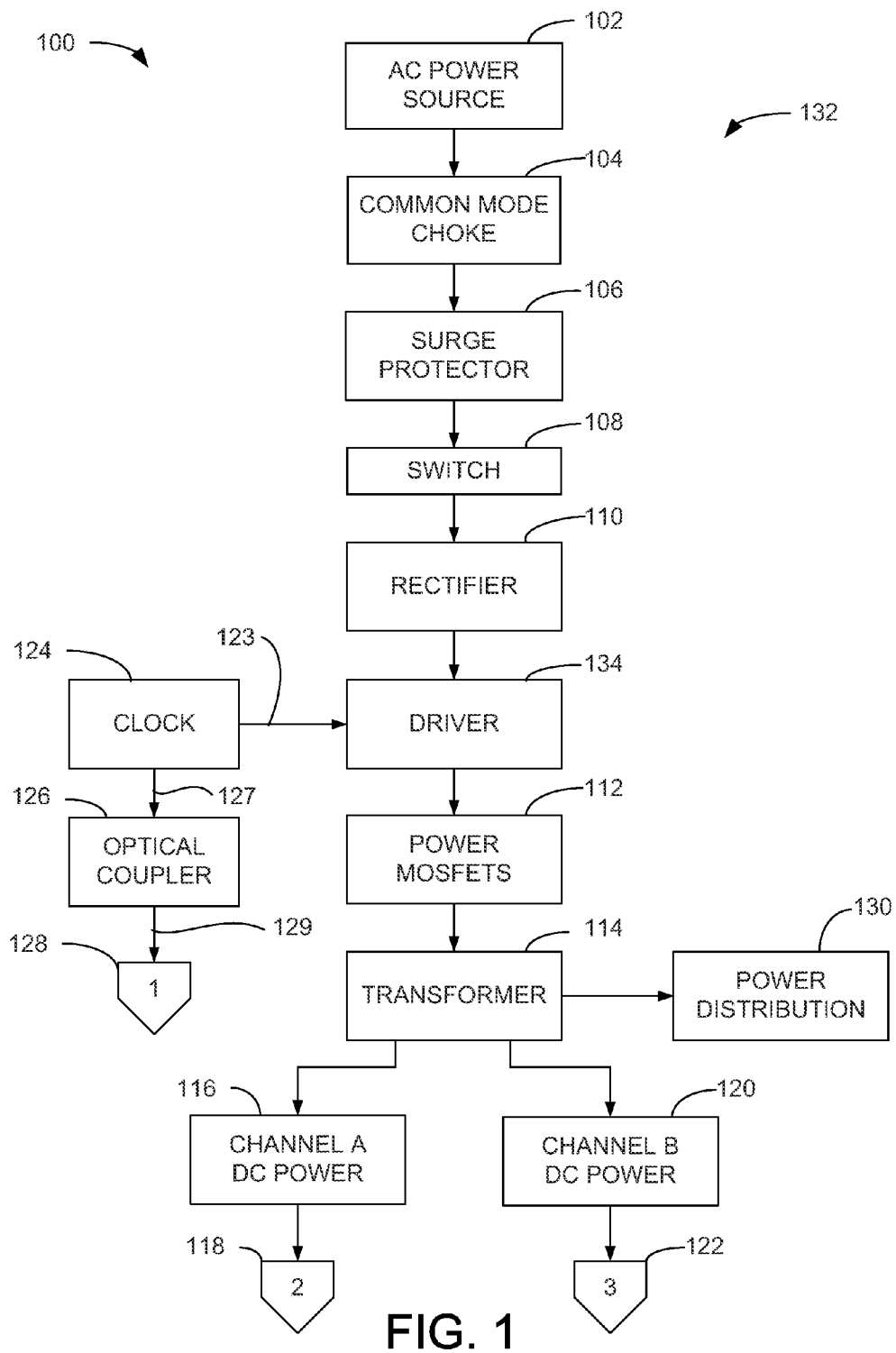
FIG. 1 is a diagrammatic view illustrating an exemplary embodiment of the power supply and clock of the exemplary embodiment of the improved audio power amplifier, according to a preferred embodiment of the present invention.

In the drawings referred to herein, circles containing letters are used as on-page connectors, where as five-sided boxes containing numbers or letters are use for off-page connectors. The hundreds digit(s) in reference numbers indicate the figure in regard to which the referenced feature was first discussed. I have almost succeeded in maintaining the convention that even reference numbers are for parts and odd numbers are for signals.

FIG. 1 is a diagrammatic view illustrating an exemplary embodiment of the power supply 132 including clock 124 of the exemplary embodiment of the improved audio power amplifier 100, according to a preferred embodiment of the present invention. The 120-volt alternating current (AC) power source 102 is received at the input of a common mode choke 104, which suppresses line noise. The output of the common mode choke 104 is coupled to a transient protector 106 that protects additional circuitry from power spikes, including power-on transients caused by switch 108, which connects the output of the common mode choke 104 to the remainder of the improved audio power amplifier 100. The noise-reduced AC line voltage is applied to a full wave rectifier 110 for conversion into direct current (DC), is filtered to reduce ripple, and is applied across power metal oxide field effect transistors (MOSFETs) 112. The power MOSFETs 112 are controlled by a driver 134 in an integrated chip (IC) 1102 (see FIG. 3 and 11) to produce low noise, low ripple, DC power. The DC power is fed to multi-tapped transformer 114 to produce channel A power 116, channel B power 120, and to provide power distribution 130 DC voltages for IC power and other purposes, such as driving a fan. Channel A power 116 is connected 118 across additional power MOSFETs at the output of audio amplifier A 226 (see FIG. 2). Channel B power 120 is connected 122 across additional power MOSFETs at the output of audio amplifier B 228 (see FIG. 2).

Clock 124 is the single clock 124 for the entire improved audio power amplifier. Clock 124 provides 100 KHz signals 123 (direct and inverted) to the inputs of the driver 134 and a 200 KHz signal 127 to an optical coupler 126 that connects 128 to clock amplifier A 214 (see FIG. 2) and clock amplifier B 220 (see FIG. 2). The 200 KHz clock signal 127 is sent to the audio signal processing section 250 of the improved audio power amplifier 100, while a 100 KHz signal 123 is supplied to the driver 134 of power supply 132. This improvement eliminates several failure modes related to the old power supply clock not starting up on time causing failures of the power MOSFETs used in the prior design. The square wave clock signal driving transformer 114 eliminates the dead band of the prior art regulator and so provides a five percent increase in power.

Transformer 114 is improved to run at a higher frequency (110 KHz vs. 50 KHz in the old model) enabling it to handle twice the power without overheating. Transformer 114 is also improved to produce more output voltage for the same line voltage. As a result, the improved audio power amplifier 100 runs at a lower percentage of modulation for the same output and so has less distortion at any output level The improved audio power amplifier 100 runs at eighty percent modulation at full power, where the prior device ran at one hundred percent modulation at full power. As the improved audio power amplifier 100 maintains the modulation levels below ninety percent, it does not suffer from the oscillation and instability problems of the previous model.

Figure 2:
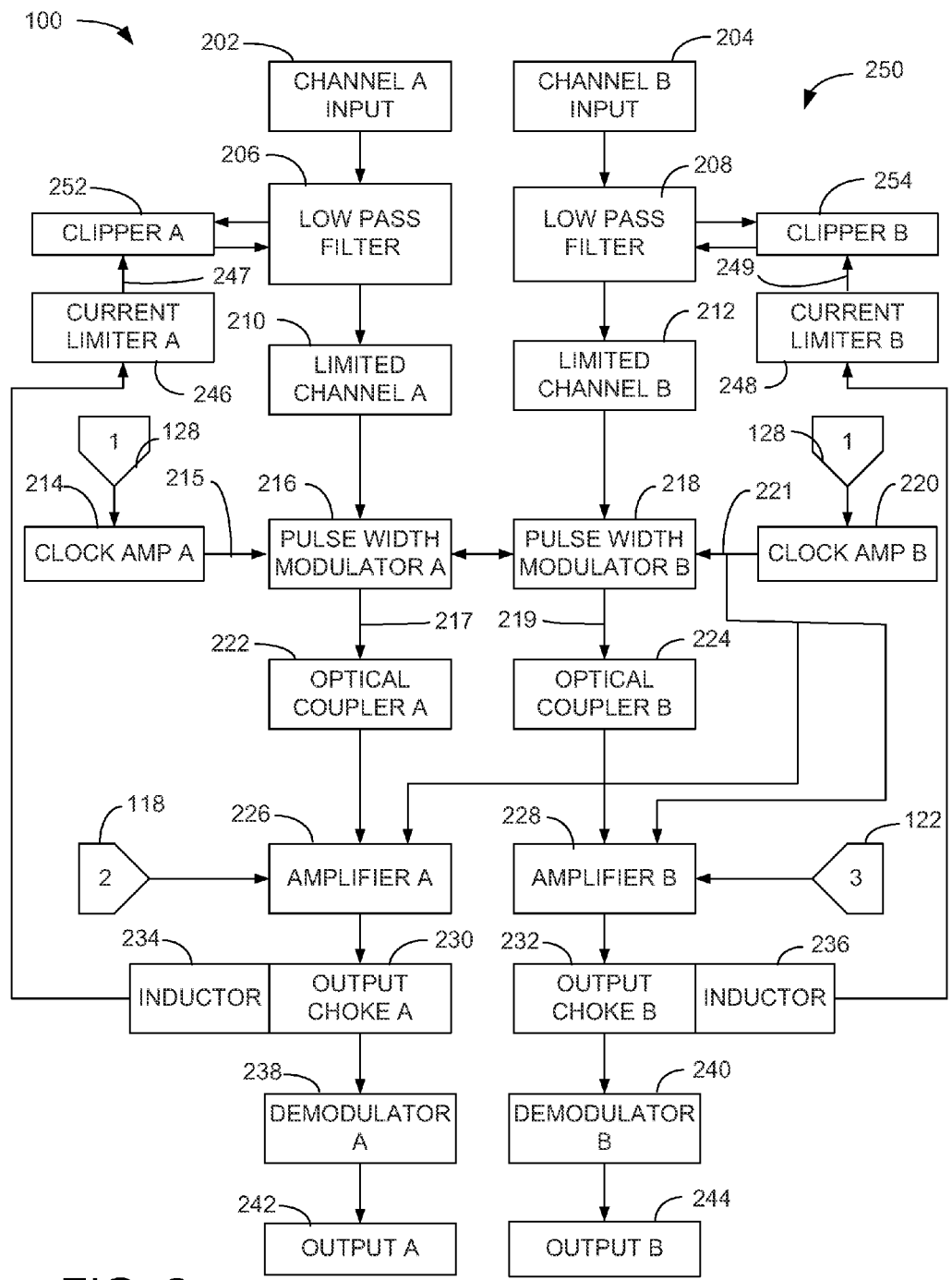
FIG. 2 is a diagrammatic view illustrating an exemplary embodiment of the audio signal processing section of the exemplary embodiment of the improved audio power amplifier, according to a preferred embodiment of the present invention.

FIG. 2 is a diagrammatic view illustrating an exemplary embodiment of the audio signal processing section 250 of the exemplary embodiment of the improved audio power amplifier 100, according to a preferred embodiment of the present invention. The improved audio power amplifier 100 is a two-channel amplifier that receives two-channel audio signal input as channel A input 202 and channel B input 204 at the input to the audio signal processing section 250. The audio signal inputs 202 and 204 are provided to respective low pass filters 206 and 208. Signal clipper A 252 receives filtered audio input from the first stage of the channel A three-stage low pass filter 206 and returns the clipped audio signal to the last two stages of filter 206 to produce limited channel A signal 210. Signal clipper B 254 receives filtered audio input from the first stage of the channel B three-stage low pass filter 208 and returns the clipped audio signal to the last two stages of filter 208 to produce limited channel B audio signal 212. Clipping limits the amplitude of the audio signal, preventing over modulation of the pulse wave modulators 216 and 218. Clippers A and B 252 and 254, respectively, are controlled by respective clipper reference voltages 247 and 249 that are either constant or from respective current limiters A 246 and B 248 that, in turn, are controlled by respective inductors 234 and 236 that sense the current from output choke A 230 and output B 232, respectively. Clipper reference voltages 247 and 249 determine the clipping level and are driven low by large currents from the output chokes 230 and 232, thereby accomplishing over current protection for the entire improved audio power amplifier 100. The second and third stages of low pass filters 206 and 208 are placed after the clippers 252 and 254 to remove unwanted harmonics from the clippers 252 and 254.

The peak-limited audio signals 210 and 212 are provided to pulse width modulators 216 and 218, respectively. Pulse width modulators 216 and 218 are synchronized by clock 124 via optical coupler 126 using amplified clock signals from clock amplifier A 214 and clock amplifier B 220, respectively. Pulse width modulated (PWM) audio signals 217 and 219 at the outputs of pulse width modulators 216 and 218, respectively, can be amplified with greater fidelity than amplitude modulated or frequency modulated signals. Pulse width modulated audio signals 217 and 219 are supplied to PWM audio amplifier A 226 and PWM audio amplifier B 228 via optical coupler A 222 and optical coupler B 224, respectively, as shown. The optical couplers isolate the PWM audio amplifiers 226 and 228 from the pulse width modulators 216 and 218, respectively.

Power for the PWM audio amplifiers 226 and 228 is provided from power supply 132 via connections 118 and 122. Gain control is not provided on the improved audio power amplifier 100, but is controlled from a motherboard that controls a plurality of amplifiers. This improvement allows an improved audio power amplifier 100 to be changed out without having to set the gain.

The four-phase modulator of the previous design was eliminated for space savings. Improved isolation of the audio amplifiers 226 and 228 is now accomplished by optical couplers 224 and 224 for audio signal isolation and transformer isolation (not shown in this view) on the lines from clock amplifier B to audio amplifiers A 226 and B 228 for ground isolation.

Clock amplifier B 220 provides clock signals to both PWM audio amplifiers 226 and 228 to ensure signal synchronization at the output of the PWM audio amplifiers 226 and 228. The clock amplification is to thirty volts peak-to-peak to improve the linearity of the modulated waveform and thereby increase the power of the output of the improved audio power amplifier 100 by eight decibels. The combination of optical couplers 222 and 224 to provide isolation of the PWM audio amplifiers 226 and 228 along with the single clock 124 for both PWM audio amplifiers enables a significantly reduced part count, as compared to the four-phase modulator in the previous invention. As a result, this improvement lowers cost, power consumption, and size of the improved audio power amplifier 100. Two 200 watt improved audio power amplifiers 100 can be mounted on a single printed circuit board in the space previously used by one 200 watt amplifier. Together with an improved power transformer 114, eighteen channels (sixteen primary and two backup) can fit into a standard 19" electronics rack chassis where only eight channels, with no backups, could be mounted per rack previously.

PWM audio amplifiers A 226 and B 228 provide outputs via output choke A 230 and output choke B 232, respectively. Inductor 234 is physically proximate to output choke A 230 and the magnetic field of the output choke A 230 induces a current in inductor 234 which is an input to current limiter A 246. Output choke A 230 is actually implemented as two output chokes, one on the positive phase of the audio output and one on the negative phase of the audio output. Only one of the two chokes need be sensed. As the current in inductor 234 rises, current limiter A 246 lowers the clipper reference voltage 247 to clipper A 252, thereby controlling the clipper A 252 to clip the input audio signal to lower levels, thus providing an output current limiter. Inductor 236 operates in the same way, producing a current from the magnetic field of output choke B 232 to control clipper B 254 with variable clipper reference voltage 249 from current limiter B 248. This improvement insures that the improved audio power amplifier 100 is protected from short circuits in any downstream circuitry and that output current stays below a predetermined maximum value to protect downstream circuitry from spikes in the audio input signals 202 and 204. Outputs of output chokes 230 and 232 are supplied to demodulator A 238 and demodulator B 240, respectively, where channel A and channel B outputs 242 and 244, respectively, are produced.

Figure 3:
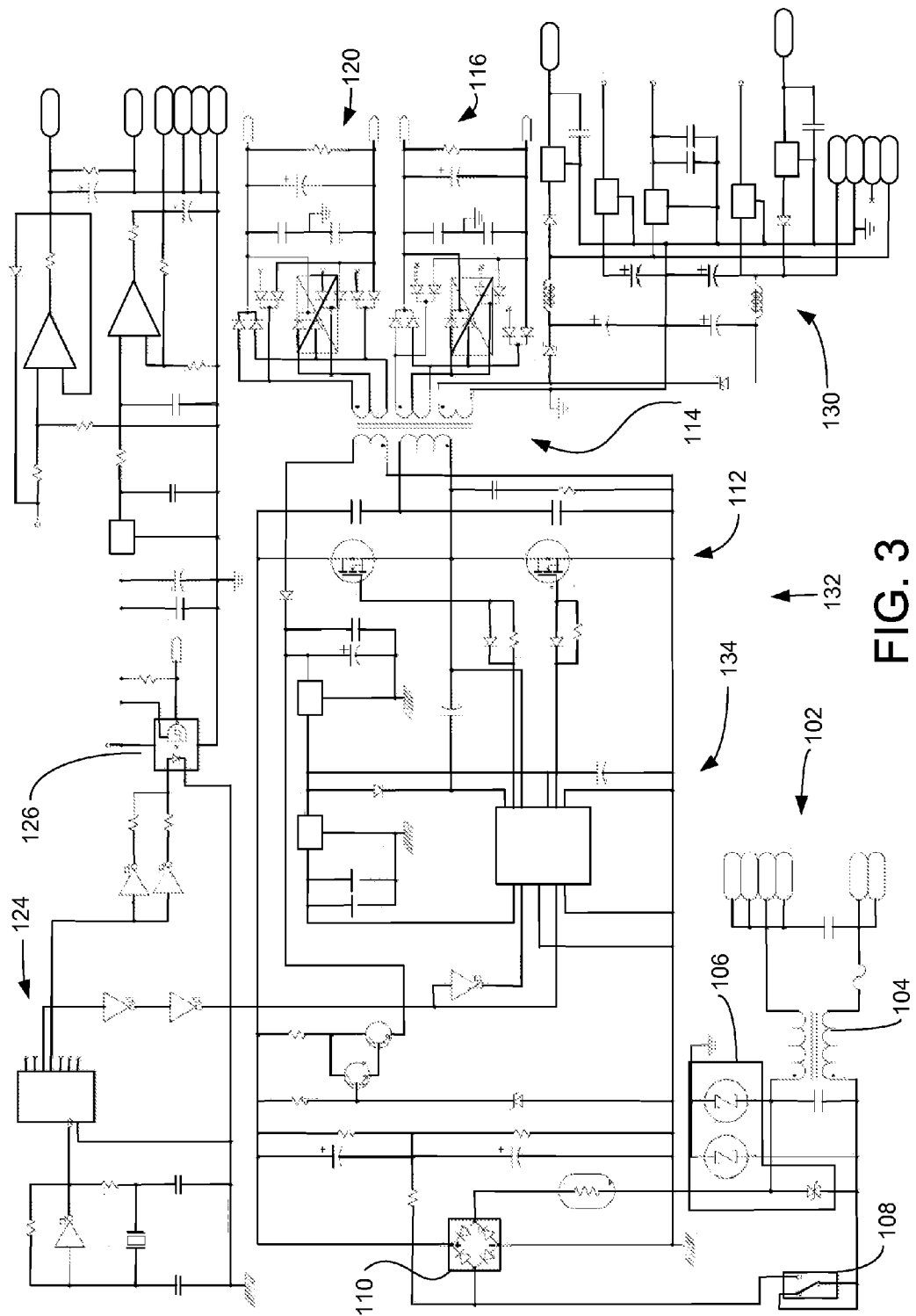
FIG. 3 is a circuit diagrammatic overview illustrating the exemplary embodiment of the power supply and clock of the exemplary embodiment of the improved audio power amplifier, according to a preferred embodiment of the present invention.

FIG. 3 is a circuit diagrammatic overview illustrating the exemplary embodiment of the power supply 132 and clock 124 of the exemplary embodiment of the improved audio power amplifier 100, according to a preferred embodiment of the present invention.

The power supply 132 is supplied with 120 volts AC or 240 volts AC, depending on the embodiment, at input 102, which is coupled to common mode choke 104 that reduces noise in the input AC. The output of the common mode choke 104 is coupled to the surge protector 106, which uses metal oxide varistors to conduct voltage spikes to ground. The AC input voltage is connected to the rectifier 110 by switch 108. Rectifier 110 is a full wave bridge rectifier with resistor-capacitor (RC) filters for smoothing out much of the ripple in the resulting DC voltage. Driver 134 controls two power MOSFETs 112. The driver 134 is initially supplied at start-up with low voltages (five and twelve volts DC) tapped from the DC first stage bridge rectifier 110 output by a large resistance and two staged power transistors and then passed through two voltage regulators that provide a five-volt tap and a twelve-volt tap. Once the improved audio power amplifier 100 is running, the low voltages are supplied from the transformer 114 through a diode, back biasing the startup transistors and shutting them off. The outputs of the power MOSFETs 112 is supplied to multi-tapped transformer 114, the output of which includes channel A power 116, channel B power 120, power distribution section 130, and bias for the low voltage power supply for driver 134. Power distribution section provides plus and minus five, twelve, and twenty volts, and fan power using voltage regulators coupled to a low voltage (twenty volts) winding of transformer 114.

Figure 4:
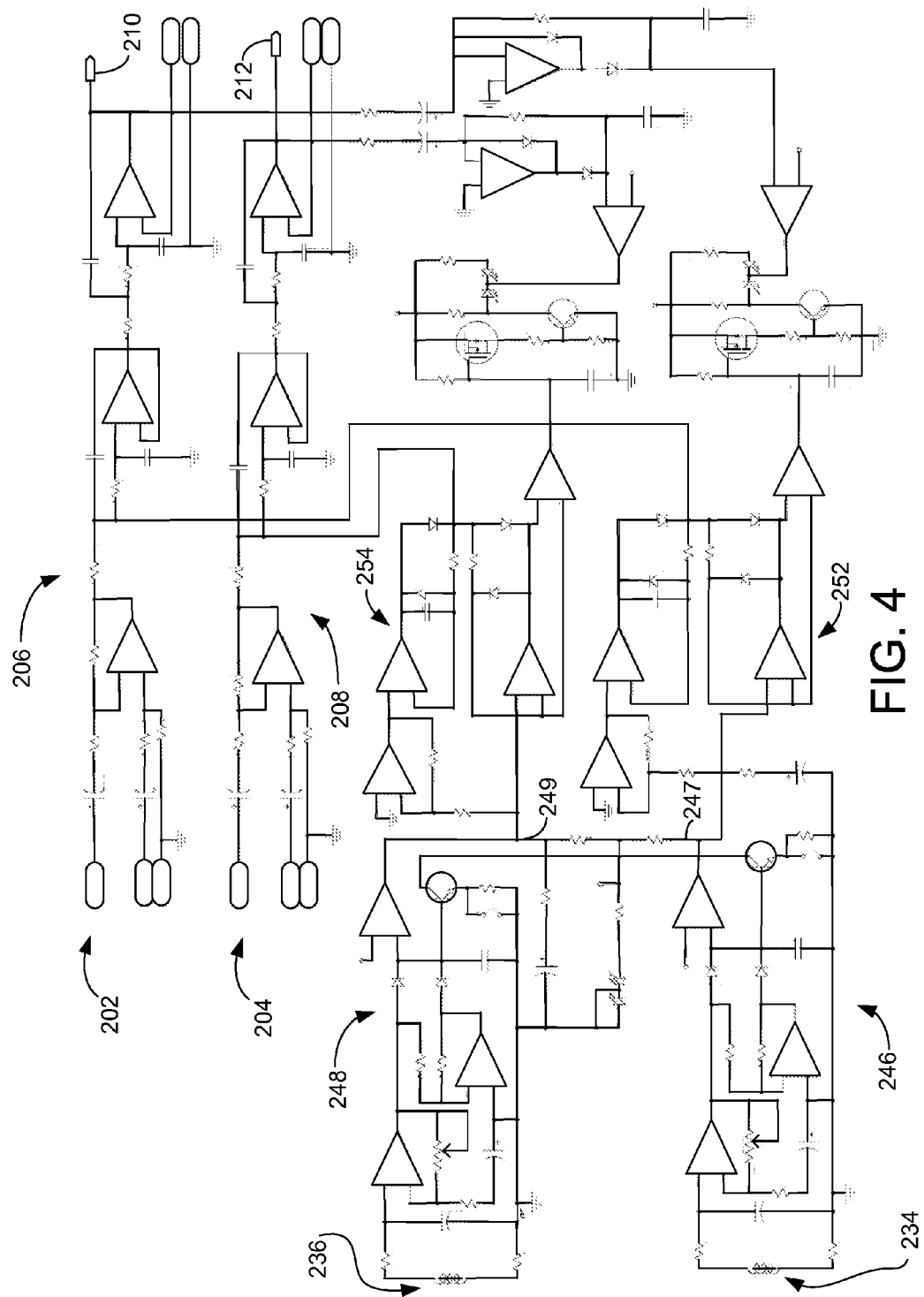
FIG. 4 is a circuit diagrammatic overview illustrating the exemplary embodiment of the audio input low pass filters, current sensors, and clippers of the exemplary embodiment of the improved audio power amplifier, according to a preferred embodiment of the present invention.

FIG. 4 is a circuit diagrammatic overview illustrating the exemplary embodiment of the audio input low pass filters 206 and 208, current sensors 246 and 248, and clippers 252 and 254 of the exemplary embodiment of the improved audio power amplifier 100, according to a preferred embodiment of the present invention. The improved audio power amplifier 100 comprises dual mode clippers A 252 and B 254 which limit the output voltage independent of load and limit the output current independent of voltage, and so function as power limiters. Outputs of the first stages of the audio input filters 206 and 208 are supplied to the clippers 252 and 254, respectively, and the last two stages of the audio input filters 206 and 208 filter the clipped audio signal. Having the last two filter stages after the clippers 252 and 254 has the advantage of removing clipper harmonics from the clipped and filtered audio signals 210 and 212, respectively.

Clippers 252 and 254 are supplied reference voltages 247 and 249, respectively, from transistors within power limiters 246 and 248. Resistors isolate the reference voltages so that the voltage limiting function of channel A is independent voltage limiting of channel B. A +/−5 volts electrical bus, or rail, is formed in each channel by supplying the inverted reference voltage to the high input of a first operational amplifier and the non-inverted reference voltage to low input of a second operational amplifier, where each of the first and second operational amplifiers also receive the filtered audio input from the first stage of the three-stage filters 206 or 208. The filtered audio input is diode isolated from the rails. The first and second operational amplifiers clamp the voltage to the levels established on the rail, which does not happen under normal operation, as the filtered audio signal will not normally exceed +/−5 volts. This voltage limiting is independent of the current limiting.

Power limiters 246 and 248 amplify the signals from inductors 234 and 236, respectively, that sense the field of output chokes 230 and 232, respectively. The amplified inductor signals for channel A and channel B are applied to the low inputs of respective operational amplifiers that each have a high input voltage fixed at five volts. If an amplified inductor signal exceeds five volts, only then will the outputs of the operational amplifiers lower the reference voltages 247 and 249 to lower the clipping of the filtered audio signal and, thereby, limit the maximum power output of the improved audio power amplifier 100. The operation of the current limiting circuit overrides the voltage limiter described in the previous paragraph. This current limiting is novel and increases the reliability of the improved audio power amplifier 100 against user errors, such as connecting the amplifier to a short circuit.

Figure 5:
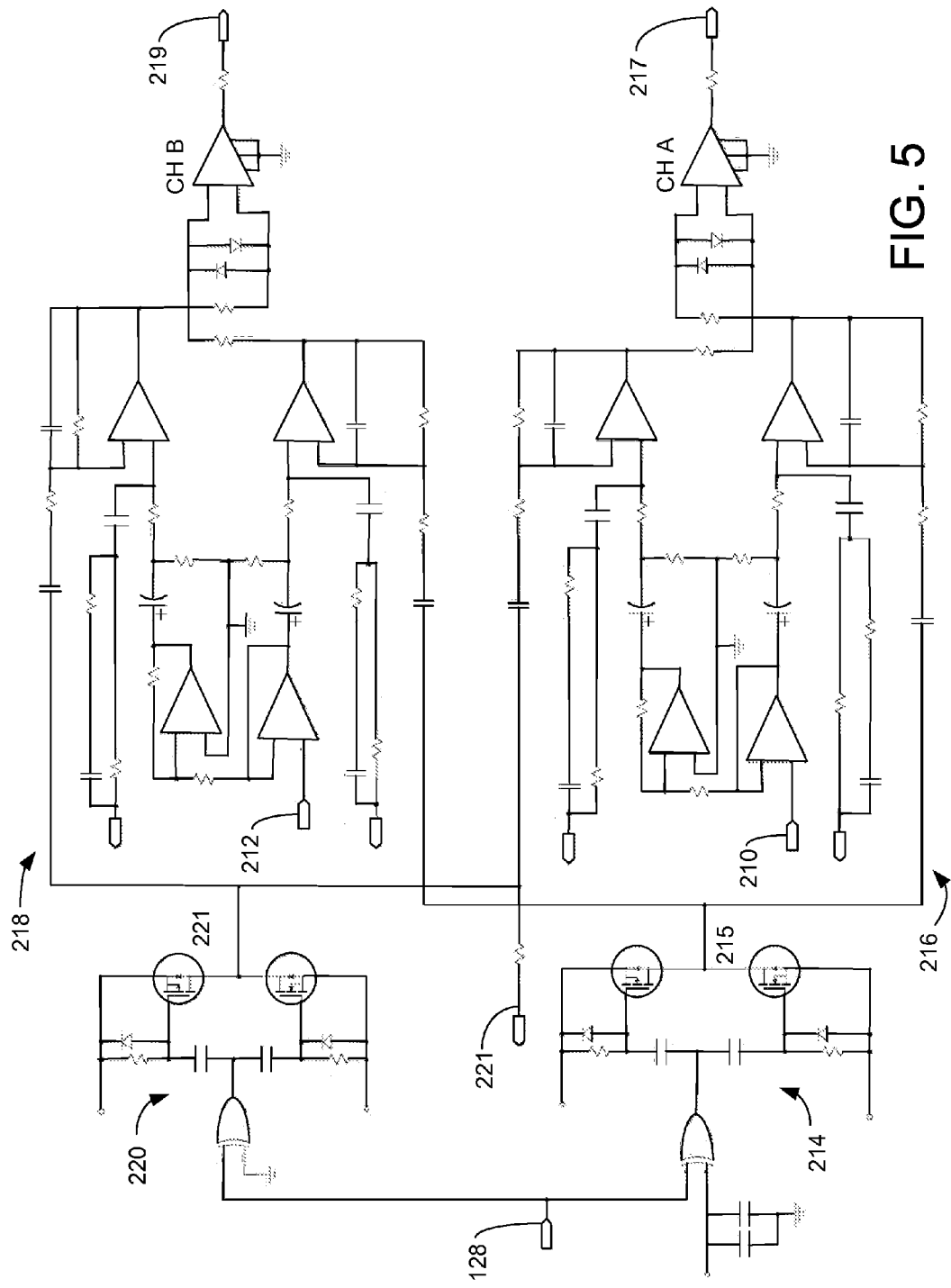
FIG. 5 is a circuit diagrammatic overview illustrating the exemplary embodiment of the pulse width modulator of the exemplary embodiment of the improved audio power amplifier, according to a preferred embodiment of the present invention.

FIG. 5 is a circuit diagrammatic overview illustrating the exemplary embodiment of the pulse width modulators 216 and 218 of the exemplary embodiment of the improved audio power amplifier 100, according to a preferred embodiment of the present invention. Clock signal connection 128 from the optical coupler 126 supplies isolated clock signal to clock signal amplifiers 214 (channel A) and 218 (channel B). Amplified clock signals 215 and 221 are supplied to each of channel A pulse width modulator 216 and channel B pulse width modulator 218. Limited channel A signal 210 and limited channel B signal 212 are the signal inputs to channel A pulse width modulator 216 and channel B pulse width modulator 218, respectively, as shown. The output of channel A pulse width modulator 216 is PWM audio signal 217 and the output of channel pulse width modulator 218 is PWM audio signal 219.

Figure 6:
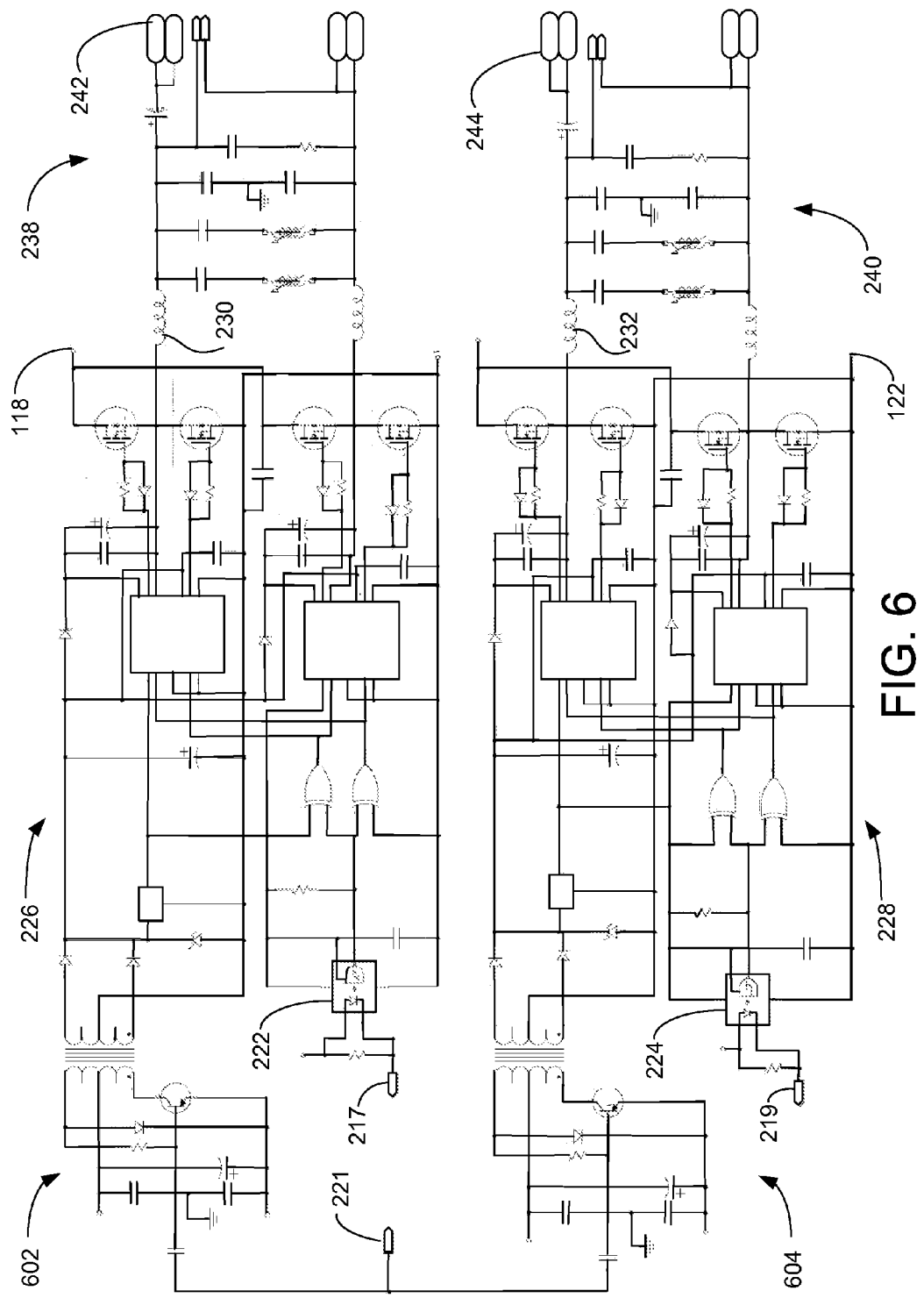
FIG. 6 is a circuit diagrammatic overview illustrating the exemplary embodiment of the power amplifier, demodulator, and output of the exemplary embodiment of the improved audio power amplifier, according to a preferred embodiment of the present invention.

FIG. 6 is a circuit diagrammatic overview illustrating the exemplary embodiment of the power amplifiers 226 and 228, demodulators 238 and 240, and output 242 and 244 of the exemplary embodiment of the improved audio power amplifier 100, according to a preferred embodiment of the present invention. Channel A PWM audio signal 217 is applied to the channel A PWM audio amplifier 226 via optical coupler 222, providing isolation of the channel A PWM audio amplifier 226. Channel B PWM audio signal 219 is applied to the channel B PWM audio amplifier 228 via optical coupler 224, providing isolation of the channel B PWM audio amplifier 228. Clock synchronization signal 221 is supplied to synchronize the power supplies 602 and 604 for channel A PWM audio amplifier 226 and channel B PWM audio amplifier 228, respectively. Channel A power 118 from power supply 132 is applied across power MOSFETs in the channel A PWM audio amplifier 226. Channel B power 122 from power supply 132 is applied across power MOSFETs in the channel B PWM audio amplifier 228. The amplified PWM audio outputs of channel A and channel B are applied to respective output chokes 230 and 232 which supply demodulators, or filters, 238 and 240, respectively to produce amplified channel A output 242 and amplified channel B output 244, respectively. The filter has been improved by adding a 200 KHz trap for the higher clock signal rejection.

Figure 7A:
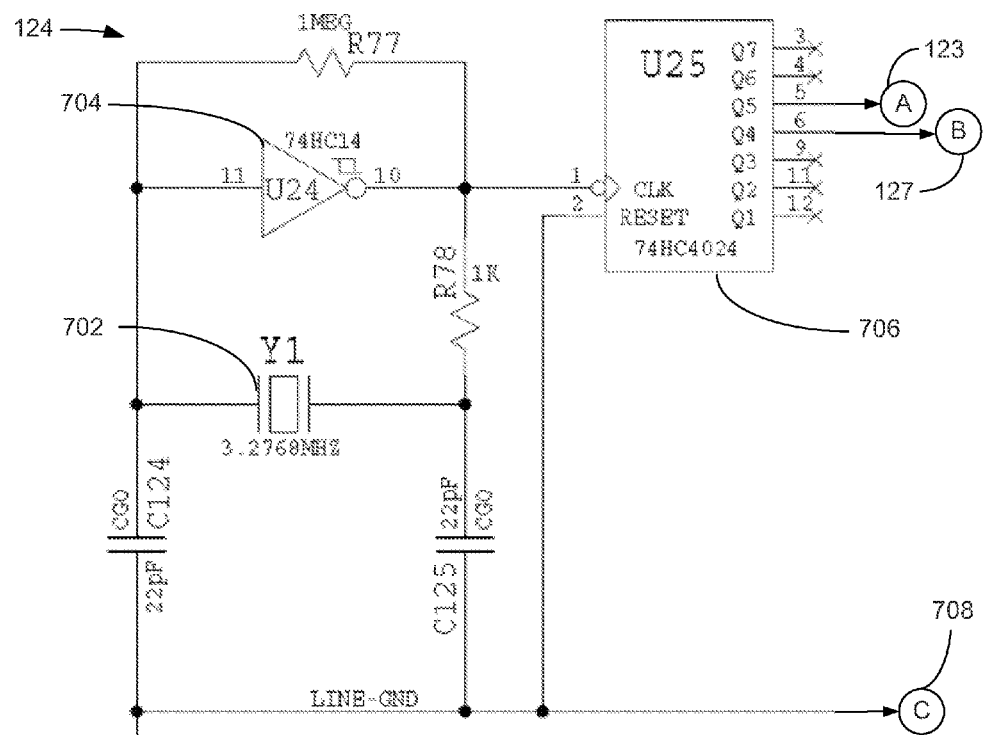
FIG. 7A is a detail view illustrating a first portion the exemplary embodiment of the clock of FIG. 1 and FIG. 3, according to a preferred embodiment of the present invention.

FIG. 7A is a detail view illustrating a first portion the exemplary embodiment of the clock of FIG. 1 and FIG. 3, according to a preferred embodiment of the present invention. Clock 124 uses an inverting Schmitt triggered buffer 704 to provide feedback to crystal 702 to supply the clock input to ripple counter 706, which provides the 100 KHz signal 123 to the power supply 132 and a 200 KHz signal 127 to optical coupler 126. The 200 KHz clock signal 127 is further amplified for use with twelve-volt logic components (see FIG. 3).

Figure 7B:
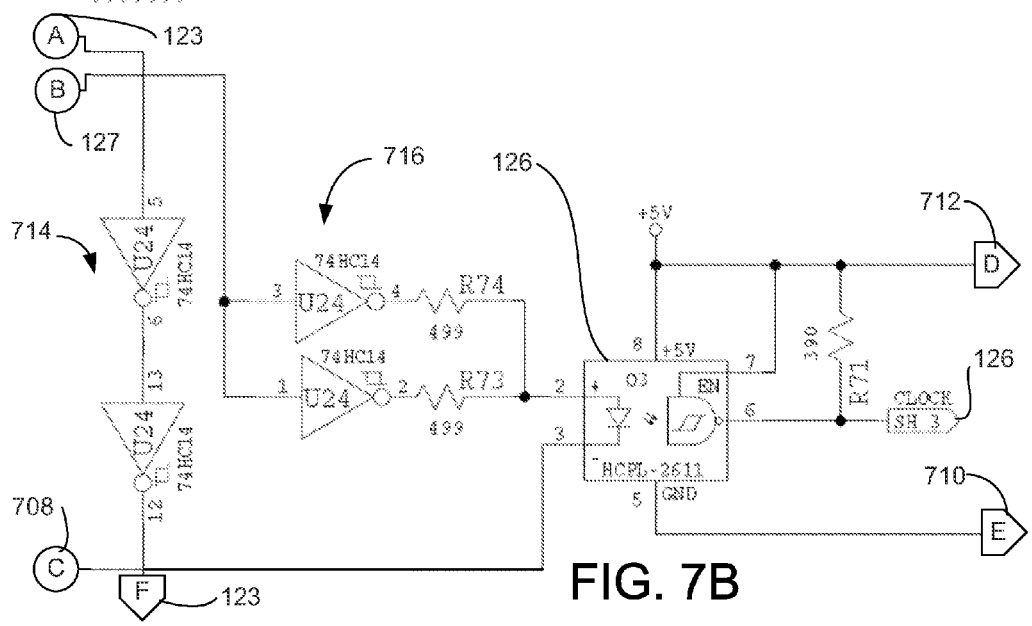
FIG. 7B is a detail view illustrating a second portion the exemplary embodiment of the clock circuitry of FIG. 1 and FIG. 3, according to a preferred embodiment of the present invention.

FIG. 7B is a detail view illustrating a second portion the exemplary embodiment of the clock circuitry of FIG. 1 and FIG. 3, according to a preferred embodiment of the present invention. The 100 KHz signal 123 to the power supply 132 is double-buffered 714 before being split (see FIG. 10) into direct 123 and inverted 1006 (see FIG. 10) 100 KHz signals for the low input and high input of the driver IC 1102 (see FIG. 11). The 200 KHz signal 127 is buffered and inverted 716 to the optical coupler 126 and the clock signal 126 from the optical coupler 126 is supplied to the clock signal amplifiers 214 and 220 (see FIGS. 2 and 5) of the audio signal processing section 250.

Figure 8A:
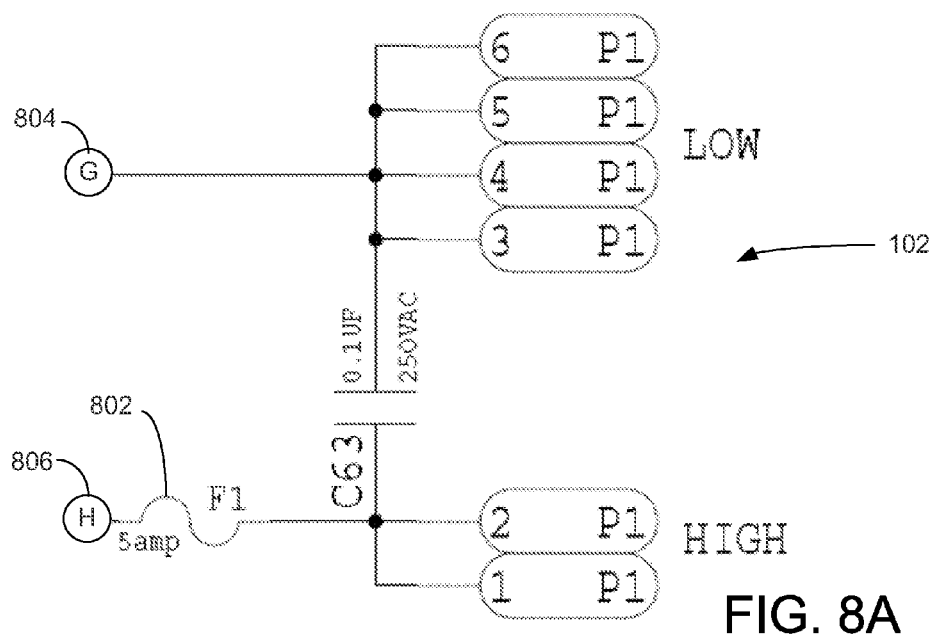
FIG. 8A is a detail view illustrating a first portion the exemplary input of the exemplary embodiment of the power supply of FIG. 1 and FIG. 3, according to a preferred embodiment of the present invention.

FIG. 8A is a detail view illustrating a first portion the exemplary input 102 of the exemplary embodiment of the power supply 132 of FIG. 1 and FIG. 3, according to a preferred embodiment of the present invention. The power supply 132 is supplied with 120 volts AC or 240 volts AC, depending on the embodiment, at input 102. The input line has a fuse 802 for circuit protection and provides AC power across lines 804 and 806.

Figure 8B:
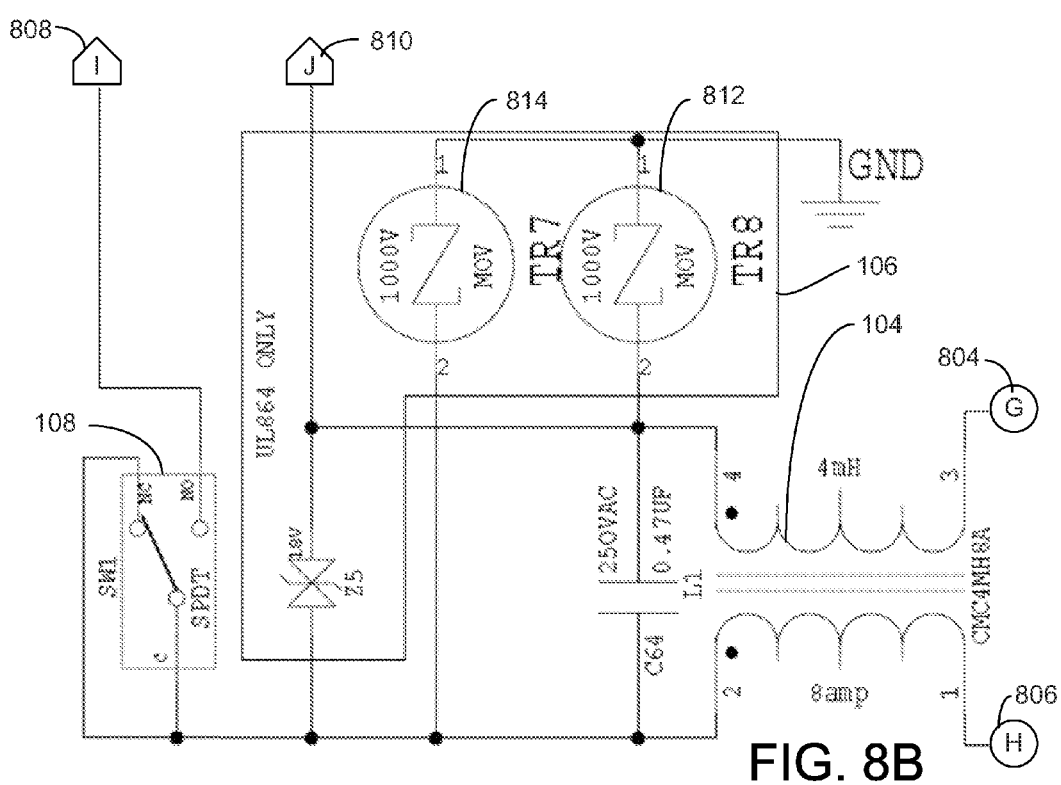
FIG. 8B is a detail view illustrating a second portion the exemplary transient protection for the input of the exemplary embodiment of the power supply of FIG. 1 and FIG. 3, according to a preferred embodiment of the present invention.

FIG. 8B is a detail view illustrating a second portion the exemplary transient protection for the input 102 of the exemplary embodiment of the power supply 132 of FIG. 1 and FIG. 3, according to a preferred embodiment of the present invention. Input 102 is coupled to common mode choke 104 that reduces noise in the input AC. The output of the common mode choke 104 is coupled to the surge protector 106, which uses metal oxide varistors 812 and 814 to conduct voltage spikes to ground. The AC input voltage is connected to the rectifier 110 by switch 108 along lines 808 and 810.

Figure 9:
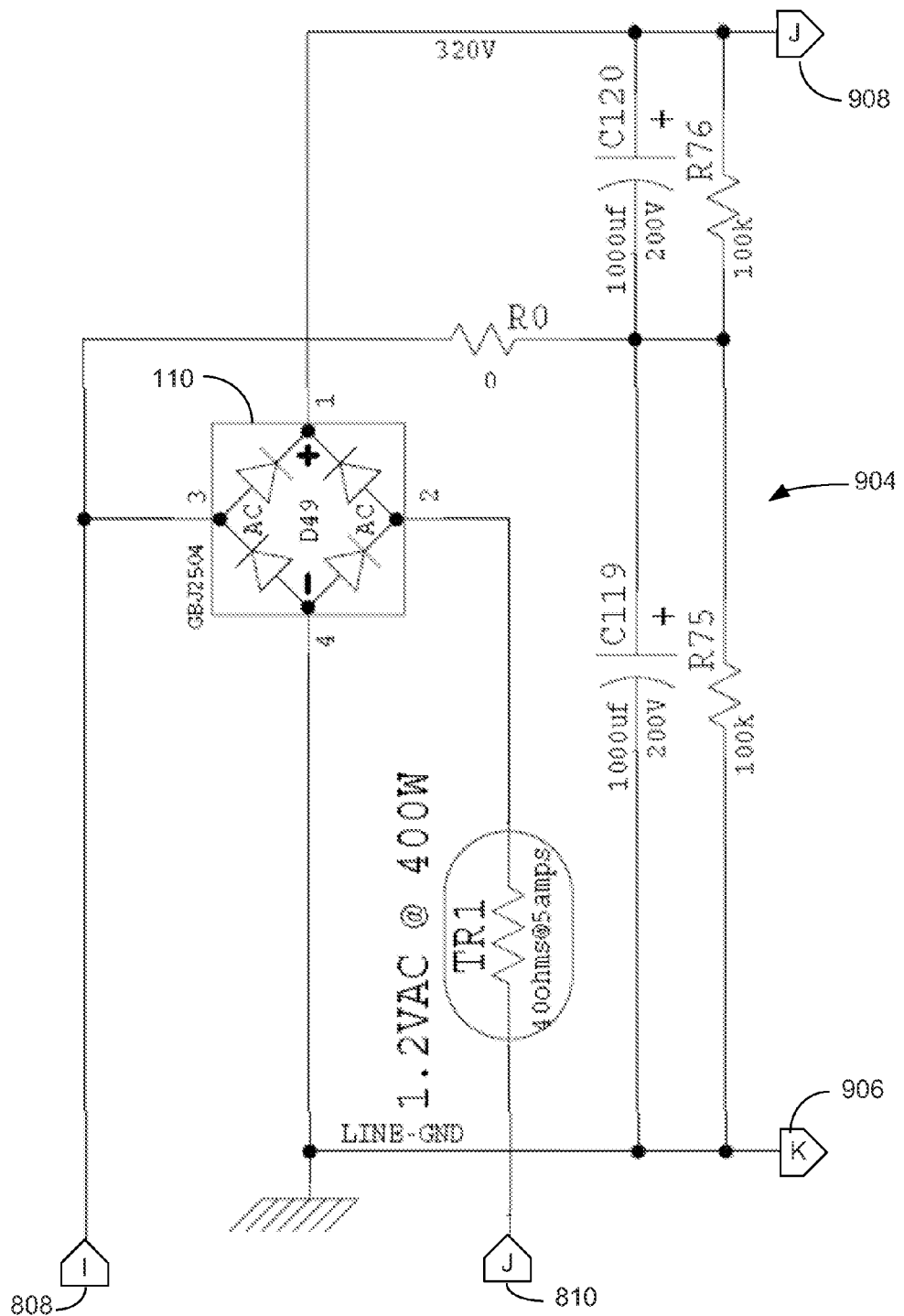
FIG. 9 is a detail view illustrating an exemplary embodiment of a full wave rectifier of the exemplary embodiment of the power supply of FIG. 1 and FIG. 3, according to a preferred embodiment of the present invention.

FIG. 9 is a detail view illustrating an exemplary embodiment of a full wave rectifier 110 of the power supply 132 of FIG. 1 and FIG. 3, according to a preferred embodiment of the present invention. Full wave bridge rectifier 110 has capacitors 904 for smoothing out much of the ripple in the resulting DC voltage. Line ground 906 is on the negative side of the DC output of the rectifier 110, and the positive side of rectifier 110 provides an output 908 of 320 volts DC.

Figure 10:
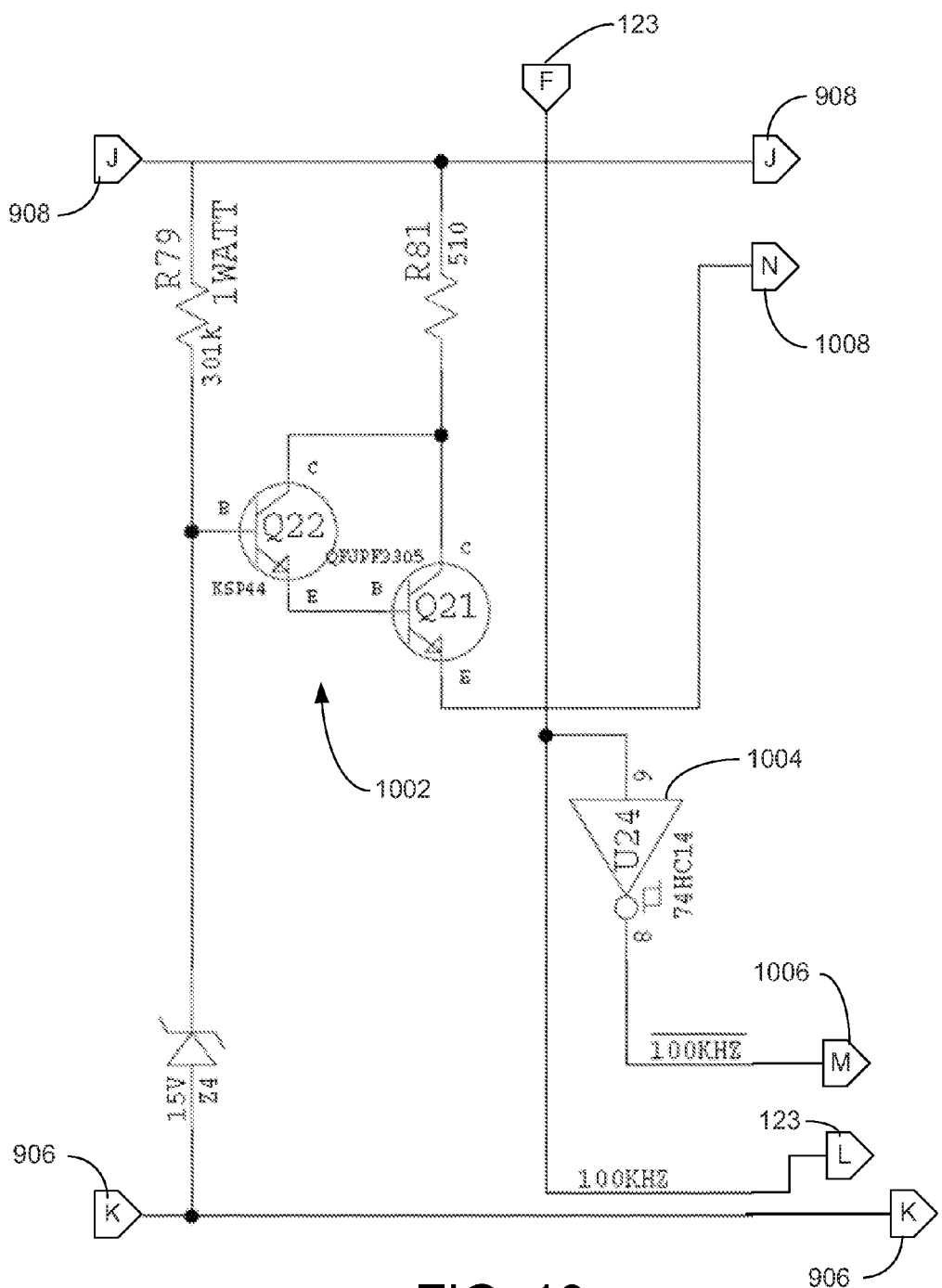
FIG. 10 is a detail view illustrating an exemplary embodiment of an exemplary temporary low voltage tap and exemplary inverting buffer of the exemplary embodiment of the power supply of FIG. 1 and FIG. 3, according to a preferred embodiment of the present invention.

FIG. 10 is a detail view illustrating an exemplary embodiment of an exemplary temporary low voltage tap and exemplary inverting buffer 1004 of the exemplary embodiment of the power supply 132 of FIG. 1 and FIG. 3, according to a preferred embodiment of the present invention. The IC driver 1102 (see FIG. 11) is initially supplied, at startup, with low voltages (five and twelve volts DC) tapped from the bridge rectifier 110 output 908 by a large resistance and two staged power transistors 1002. The low voltage from the power transistors is used only during startup. Line 1008 is the low voltage (25 volts DC) output of the low voltage tap. Once the power supply 132 is up and running, low voltage on line 1008 from transformer 114 back biases power transistors 1002 and thereby shuts them down. During operation, transformer 114 supplies the low voltages to driver 134 IC 1102. The 100 KHz clock signal 123 is inverted 1004 for the high input 1006 of driver 134 IC 1102 and the non-inverted 100 KHz clock signal 123 is applied to the low input of driver 134 IC 1102.

Figure 11:
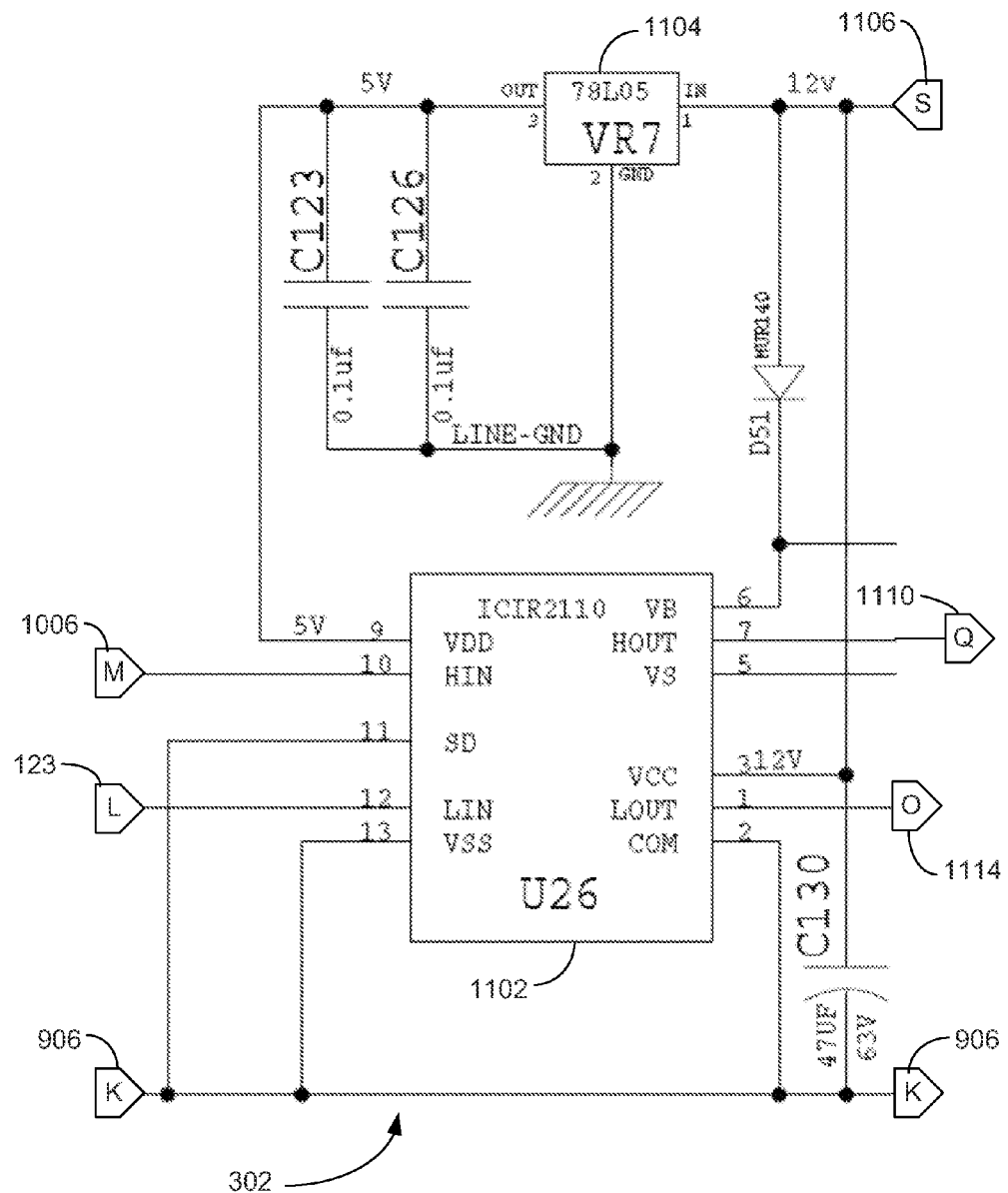
FIG. 11 is a detail view illustrating an exemplary embodiment of an integrated circuit driver of the exemplary embodiment of the power supply of FIG. 1 and FIG. 3, according to a preferred embodiment of the present invention.

FIG. 11 is a detail view illustrating an exemplary embodiment of an integrated circuit 1102 of the exemplary embodiment of the power supply 132 of FIG. 1 and FIG. 3, according to a preferred embodiment of the present invention. Inverted clock signal 1006 is supplied to the high input of driver 134 IC 1102 and the non-inverted clock signal 123 is supplied to the low input of driver 134 IC 1102. The amplified output is taken from the high output pin 1110 and the low output line 1114. Five-volt and twelve-volt 1106 DC voltages for operating the driver 134 IC 1102 are supplied from the low voltage tap 1210 from transformer 114 through two sequential three-terminal voltage regulators 1202 (see FIG. 12) and 1104. The driver 134, taken as a whole, is illustrated in FIGS. 11 and 12.

Figure 12:
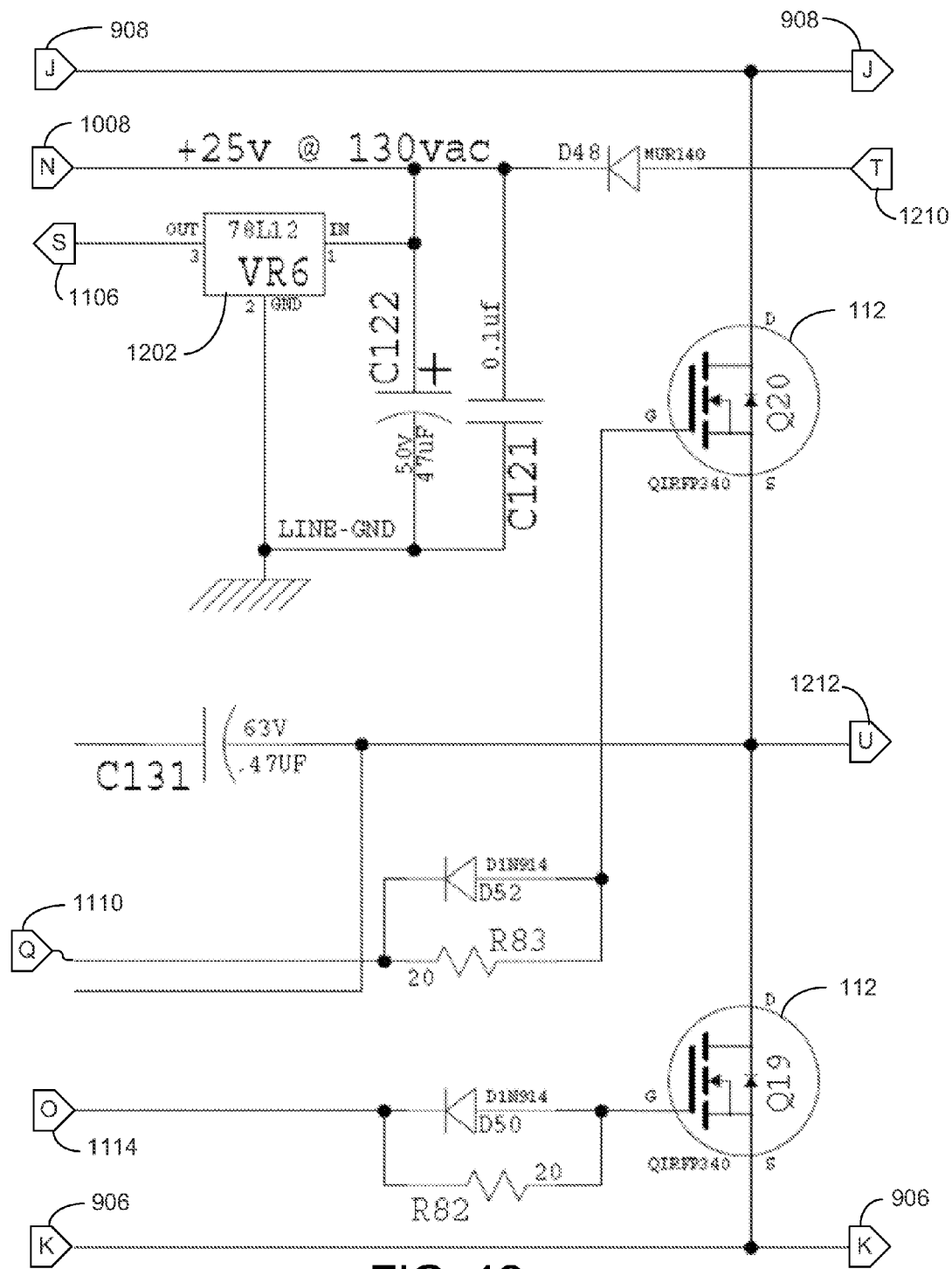
FIG. 12 is a detail view illustrating an exemplary embodiment of a dual power MOSFET amplification stage of the exemplary embodiment of the power supply, including a low voltage supply, of FIG. 1 and FIG. 3, according to a preferred embodiment of the present invention.

FIG. 12 is a detail view illustrating an exemplary embodiment of a dual power MOSFET 112 amplification stage of the exemplary embodiment of the power supply 132, including a low voltage power supply of FIG. 1 and FIG. 3, according to a preferred embodiment of the present invention. High voltage DC from the full wave bridge rectifier 902 is applied across two power MOSFETs 112 to ground 906. A first power MOSFET 112 is controlled by the high output 1110 of driver 134 IC 1102 and a second power MOSFET 112 is controlled by the low output 1114 of driver 134 IC 1102, as shown, resulting in push-pull amplified power between ground 906 and high voltage line 908 output creating square wave 1212. The low voltage windings 1302 (see FIG. 13) of transformer 114 provide low voltage DC 1210 to the driver 134 IC 1102.

Figure 13:
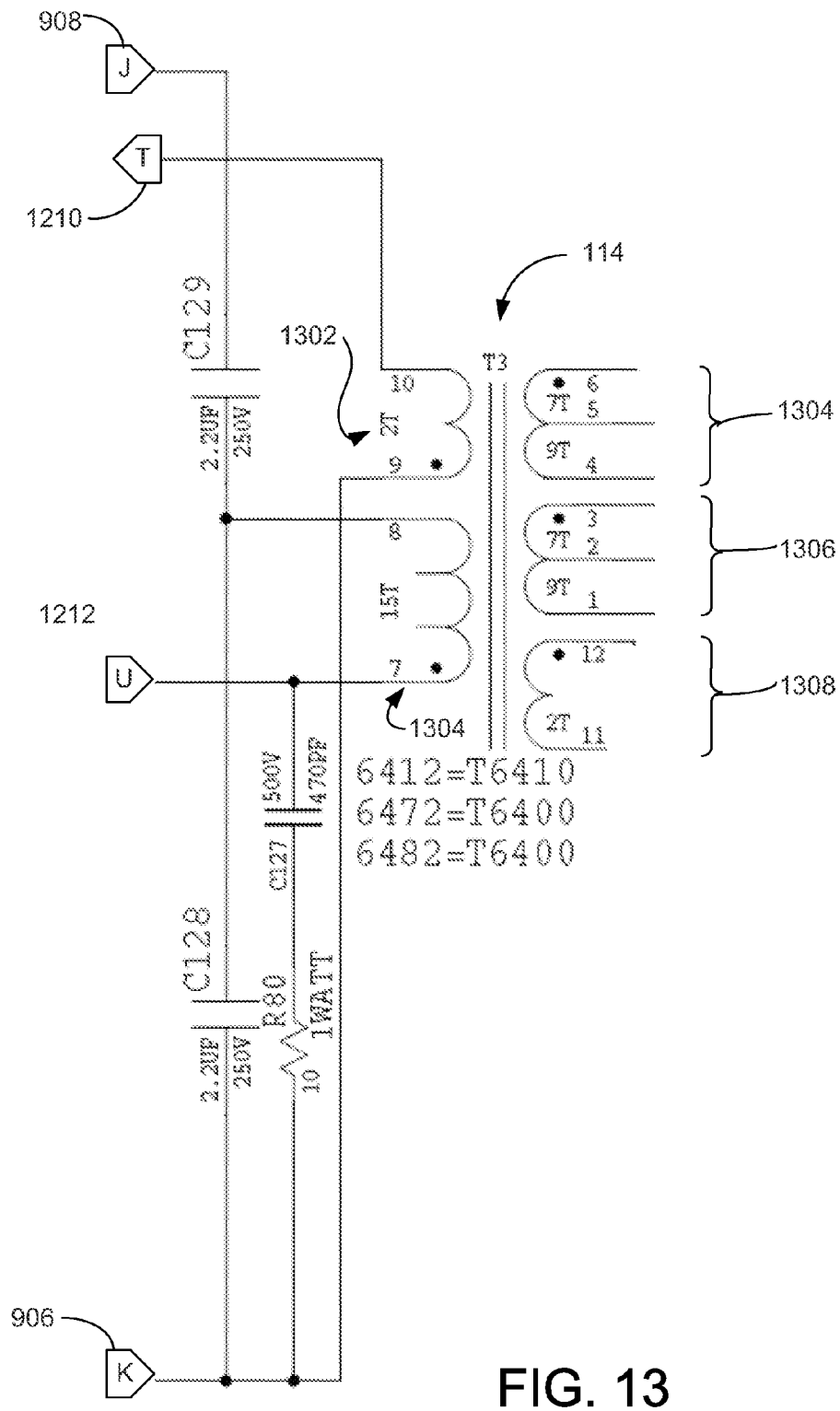
FIG. 13 is a detail view illustrating an exemplary embodiment of a power transformer of the exemplary embodiment of the power supply of FIG. 1 and FIG. 3, according to a preferred embodiment of the present invention.

FIG. 13 is a detail view illustrating an exemplary embodiment of a power transformer 114 of the exemplary embodiment of the power supply 132 of FIG. 1 and FIG. 3, according to a preferred embodiment of the present invention. Low voltage output windings 1302 provide DC power 1210 and the high voltage input windings 1304 are supplied by the square wave 1212. Output windings 1304 provide inputs to filters supplying the channel B output 120. Output windings 1306 provide inputs to filters supplying the channel A output 116. Outputs 116 and 120 will provide the amplification power to the channel A and channel B audio amplifiers 226 and 228, respectively. Output windings 1308 provide inputs to filters supplying the power distribution 130 outputs.

Figure 14:
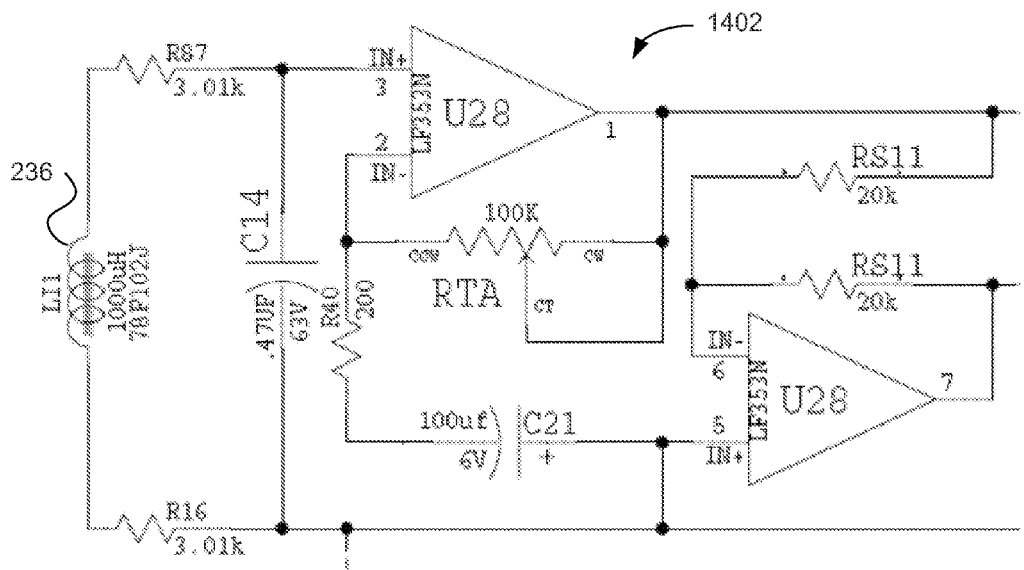
FIG. 14 is a detail view illustrating an exemplary embodiment of an input stage of the exemplary embodiment of the current sensing input of FIG. 2 and FIG. 4, according to a preferred embodiment of the present invention.

FIG. 14 is a detail view illustrating an exemplary embodiment of an input stage 1402 of the exemplary embodiment of the channel B current limiter 248 of FIG. 2 and FIG. 4, according to a preferred embodiment of the present invention. Inductor 236 is in close physical proximity with output choke 232 (see FIG. 2) and within the magnetic field of output choke 232 in order to develop an input reference voltage 249 for channel B clipper 254. The higher the field from choke 232, the greater the clipping of the input audio signal 204. In this manner, excessive current through the improved audio power amplifier 100 is prevented, even in the case of a short across the load. The clipper B 254 only operates when the current in inductor 236 exceeds a predetermined current established by the variable resistance in the feedback loop of the first op amp U28. Accordingly, during normal operations, clipping will not occur. The channel A clipper 252 is similar.

Figure 15:
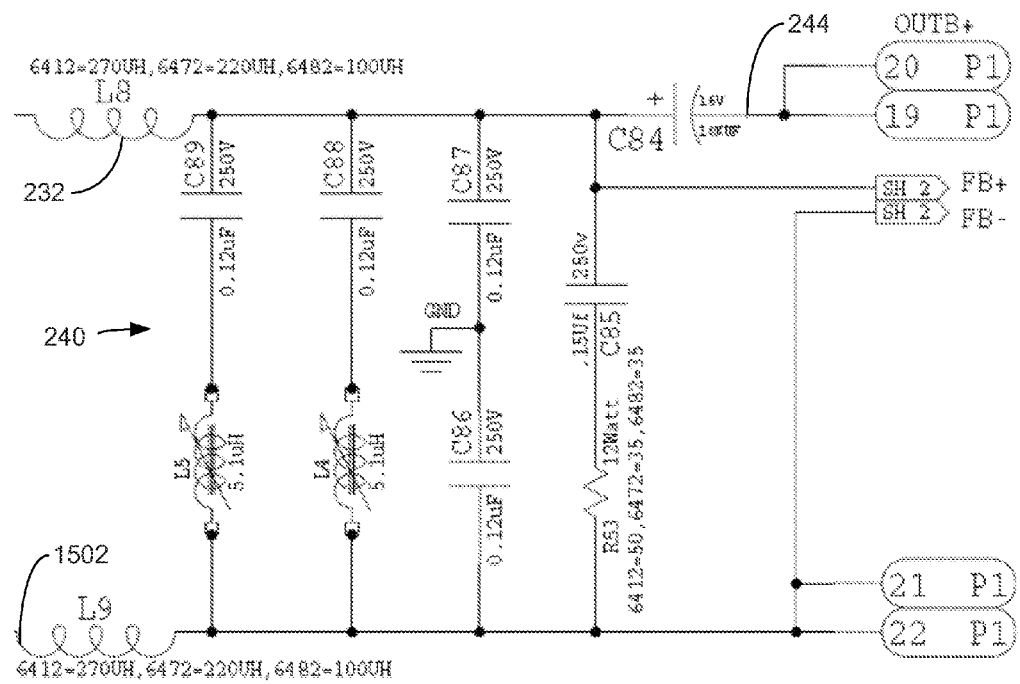
FIG. 15 is a detail view illustrating an exemplary embodiment of an output choke and demodulator of the exemplary embodiment of the audio amplification section of FIG. 2 and FIG. 6, according to a preferred embodiment of the present invention.

FIG. 15 is a detail view illustrating an exemplary embodiment of an output choke 232 and demodulator 240 of the exemplary embodiment of the audio amplification section 250 of FIG. 2 and FIG. 6, of the improved audio power amplifier 100, according to a preferred embodiment of the present invention. Of the two output chokes 232 and 1502, sensing the choke 232 is selected. The channel A output choke 230 is similar.

Figure 16:
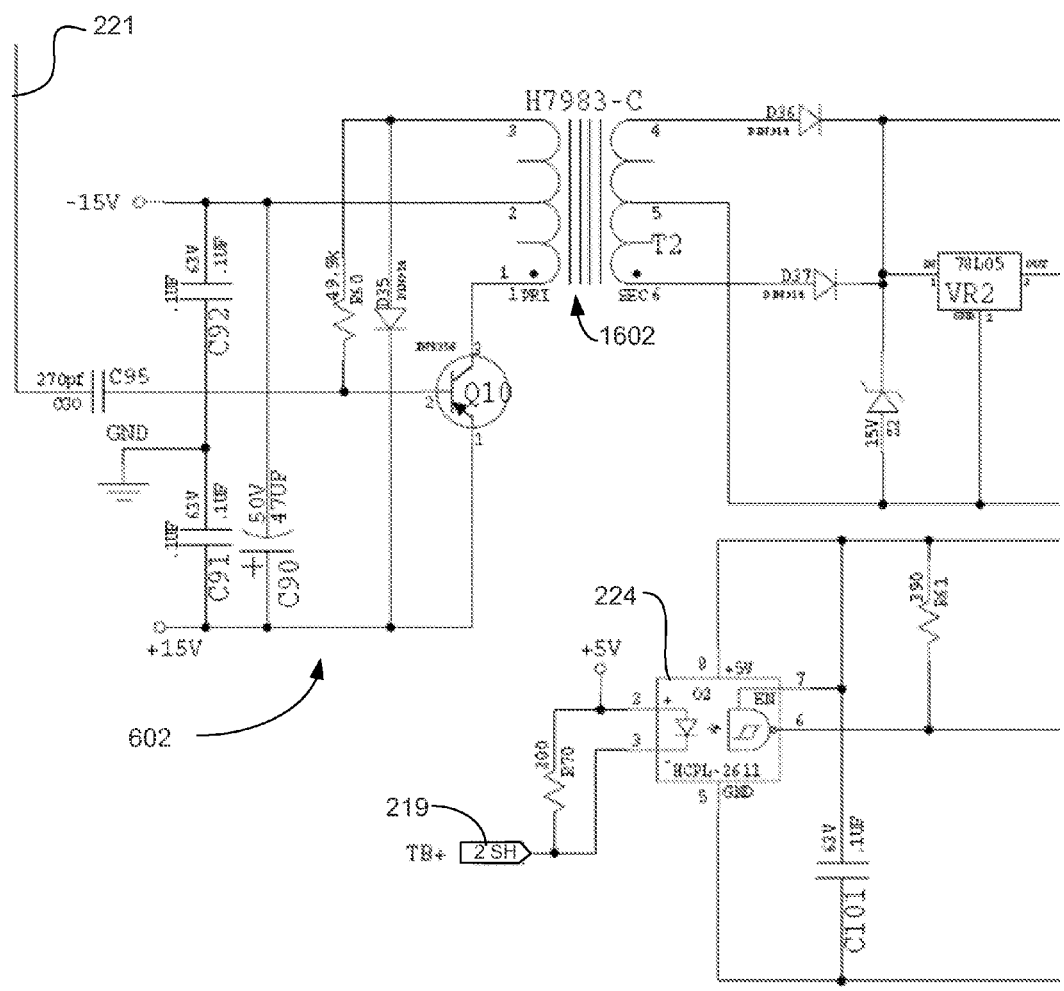
FIG. 16 is a detail view illustrating an exemplary embodiment of power and audio isolation to the exemplary embodiment of the audio amplification section of FIG. 2 and FIG. 6, according to a preferred embodiment of the present invention.

FIG. 16 is a detail view illustrating an exemplary embodiment of power 602 and audio 224 isolation to the exemplary embodiment of the audio amplification section 250 of FIG. 2 and FIG. 6, according to a preferred embodiment of the present invention. The channel A audio amplifier 226 input is shown. The channel B audio amplifier 228 input is similar. Pulse width modulated audio signal 219 is provided as an input to optical coupler 224, thereby isolating the channel A audio amplifier 226 from the pulse width modulator 218. Optically coupled amplified clock signal 221 is supplied to synchronize isolated power supply 602 that delivers power to the audio output amplifier 226 at the input of isolation transformer 1602.

Although applicant has described applicant's preferred embodiments of this invention, it will be understood that the broadest scope of this invention includes such modifications as diverse shapes and sizes and materials. Such scope is limited only by the above specification and the claims below.

Further, many other advantages of applicant's invention will be apparent to those skilled in the art from the above descriptions.

We claim:

1. An improved audio power amplifier having first and second audio channels and each said first and second channel comprising a clipper, a pulse width modulator, a pulse width modulated (PWM) audio amplifier, and a demodulator, the improvement comprising:
    a. first and second optical couplers isolating said first and second PWM audio amplifiers from said first and second pulse width modulators, respectively; and
    b. a single clock generating a first frequency for operating said first and second pulse width modulators and said first and second PWM audio amplifiers and a second frequency for operating a direct current power supply for supplying power to said first and second audio amplifiers, respectively.

2. The improved power audio amplifier of claim 1, wherein said first frequency is twice said second frequency.

3. The improved power audio amplifier of claim 2, further comprising the improvement of:
    a. an optical coupler and first and second clock signal amplifiers operable to couple and then amplify said first frequency and operable to supply said coupled and amplified first frequency to said first and second pulse width modulators, respectively; and
    b. said optical coupler, third and fourth clock signal amplifiers, and first and second isolating transformers operable to couple, then amplify, and then transform said first frequency and operable to supply said coupled, amplified, and transformed first frequency to said first and second PWM audio amplifiers, respectively.

4. The improved power audio amplifier of claim 3, wherein said first and second clock signal amplifiers are operable to produce a peak-to-peak output of thirty volts to said first and second pulse width modulators to improve linearity of first and second pulse width modulator output waveforms, respectively.

5. The improved power audio amplifier of claim 1, further comprising the improvement of first and second output power limiters for said first and second channels, respectively, further comprising first and second inductors positioned within first and second magnetic fields of first and second output chokes, respectively, wherein said first and second inductors are operable to control said first and second clippers, respectively.

6. The improved power audio amplifier of claim 1, further comprising the improvement of mounting said first and second audio channels on a single printed circuit board.

7. The improved power audio amplifier of claim 1, further comprising the improvement of first and second clock amplifiers operable to supply an amplified signal from said clock to drive a power supply output transformer with no dead band.

8. The improved power audio amplifier of claim 1, further comprising the improvement of a power supply output transformer operable to receive an input voltage of at least 280 volts to maintain the percentage of modulation of said improved power audio amplifier below ninety percent.

9. The improved power audio amplifier of claim 1, further comprising the improvement of locating a gain control device for said improved power audio amplifier separate from, and operable to be releasably coupled to, said improved power audio amplifier to enable said improved power audio amplifier to be changed out without having to set said gain on said improved power audio amplifier.

10. An improved audio power amplifier having first and second audio channels and each said first and second channel comprising a clipper, a pulse width modulator, a pulse width modulated (PWM) audio amplifier, and a demodulator, the improvement comprising:
   a. first and second optical couplers isolating said first and second PWM audio amplifiers from said first and second pulse width modulators, respectively;
   b. a single clock generating a first frequency for operating said first and second pulse width modulators and said first and second PWM audio amplifiers and a second frequency for operating a direct current power supply for supplying power to said first and second audio amplifiers, respectively; and
   c. wherein said first frequency is twice said second frequency.

11. The improved power audio amplifier of claim 10, further comprising the improvement of:
   a. an optical coupler and first and second clock signal amplifiers operable to couple and then amplify said first frequency and operable to supply said coupled and amplified first frequency to said first and second pulse width modulators, respectively; and
   b. said optical coupler, third and fourth clock signal amplifiers, and first and second isolating transformers operable to couple, then amplify, and then transform said first frequency and operable to supply said coupled, amplified, and transformed first frequency to said first and second PWM audio amplifiers, respectively.

12. The improved power audio amplifier of claim 11, wherein said first and second clock signal amplifiers are operable to produce a peak-to-peak output of thirty volts to said first and second pulse width modulators to improve linearity of first and second pulse width modulator output waveforms, respectively.

13. The improved power audio amplifier of claim 10, further comprising the improvement of first and second output power limiters for said first and second channels, respectively, further comprising first and second inductors positioned within first and second magnetic fields of first and second output chokes, respectively, wherein said first and second inductors control said first and second clippers, respectively.

14. The improved power audio amplifier of claim 10, further comprising the improvement of three buffers configured to supply direct and inverted said second frequency signals to drive a power supply output transformer with no dead band.

15. The improved power audio amplifier of claim 10, further comprising the improvement of a power supply output transformer operable to receive an input voltage of at least 280 volts to maintain the percentage of modulation of said improved power audio amplifier below ninety percent.

16. The improved power audio amplifier of claim 1, further comprising the improvement of locating a gain control device for said improved power audio amplifier separate from, and operable to be releasably coupled to, said improved power audio amplifier to enable said improved power audio amplifier to be changed out without having to set said gain on said improved power audio amplifier.

17. An improved audio power amplifier having first and second audio channels and each said first and second channel comprising a clipper, a pulse width modulator, a pulse width modulated (PWM) audio amplifier, and a demodulator, the improvement comprising:
   a. first and second optical couplers isolating said first and second PWM audio amplifiers from said first and second pulse width modulators, respectively;
   b. a single clock generating a first frequency for operating said first and second pulse width modulators and said first and second PWM audio amplifiers and a second frequency for operating a direct current power supply for supplying power to said first and second audio amplifiers, respectively;
   c. wherein said first frequency is twice said second frequency;
   d. an optical coupler and first and second clock signal amplifiers operable to couple and then amplify said first frequency and operable to supply said coupled and amplified first frequency to said first and second pulse width modulators, respectively;
   e. wherein said first and second clock signal amplifiers are operable to produce a peak-to-peak output of thirty volts to said first and second pulse width modulators to improve linearity of first and second pulse width modulator output waveforms, respectively; and
   f. said optical coupler, third and fourth clock signal amplifiers, and first and second isolating transformers operable to couple, then amplify, and then transform said first frequency and operable to supply said coupled, amplified, and transformed first frequency to said first and second PWM audio amplifiers, respectively.

18. The improved power audio amplifier of claim 10, further comprising the improvement of first and second output power limiters for said first and second channels, respectively, further comprising first and second inductors positioned within first and second magnetic fields of first and second output chokes, respectively, wherein said first and second inductors control said first and second clippers, respectively.

19. The improved power audio amplifier of claim 10, further comprising the improvement of a power supply transformer:
   a. operable to be driven by direct and inverted said second frequency to avoid a dead band; and
   b. operable to receive an input voltage of at least 280 volts to maintain the percentage of modulation of said improved power audio amplifier below ninety percent.

20. The improved power audio amplifier of claim 1, further comprising the improvement of locating a gain control device for said improved power audio amplifier separate from, and operable to be releasably coupled to, said improved power audio amplifier to enable said improved power audio amplifier to be changed out without having to set said gain on said improved power audio amplifier.

* * * * *